(12) United States Patent
Zhang et al.

(10) Patent No.: US 9,196,631 B1
(45) Date of Patent: Nov. 24, 2015

(54) ARRAY SUBSTRATE AND METHOD FOR MANUFACTURING THE SAME, AND DISPLAY DEVICE

(71) Applicants: BOE TECHNOLOGY GROUP CO., LTD., Bejing (CN); BEIJING BOE OPTOELECTRONICS TECHNOLOGY CO., LTD., Beijing (CN)

(72) Inventors: Wenyu Zhang, Beijing (CN); Zhenyu Xie, Beijing (CN); Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/498,066

(22) Filed: Sep. 26, 2014

(30) Foreign Application Priority Data

Apr. 30, 2014 (CN) .......................... 2014 1 0183494

(51) Int. Cl.
| | |
|---|---|
| *H01L 27/12* | (2006.01) |
| *H01L 21/027* | (2006.01) |
| *H01L 29/786* | (2006.01) |
| *H01L 29/66* | (2006.01) |
| *H01L 29/06* | (2006.01) |
| *G02F 1/1368* | (2006.01) |
| *G02F 1/1362* | (2006.01) |

(52) U.S. Cl.
CPC .......... *H01L 27/1222* (2013.01); *G02F 1/1368* (2013.01); *G02F 1/136286* (2013.01); *H01L 27/124* (2013.01); *H01L 27/127* (2013.01); *H01L 27/1288* (2013.01); *H01L 29/0692* (2013.01); *H01L 29/66742* (2013.01); *H01L 29/78696* (2013.01)

(58) Field of Classification Search
CPC ....................................................... H01L 21/027
See application file for complete search history.

(56) References Cited

U.S. PATENT DOCUMENTS

| 8,537,327 B2 * | 9/2013 | Qin ................................ 349/187 |
| 2008/0030639 A1 * | 2/2008 | Qiu et al. ......................... 349/46 |
| 2010/0012946 A1 * | 1/2010 | Zhi et al. .......................... 257/72 |
| 2013/0222726 A1 * | 8/2013 | Choi et al. ....................... 349/43 |
| 2014/0187001 A1 * | 7/2014 | Guo ............................... 438/158 |

* cited by examiner

*Primary Examiner* — Lex Malsawma
(74) *Attorney, Agent, or Firm* — Nath Goldberg & Meyer; Joshua B. Goldberg; Christopher Thomas

(57) ABSTRACT

Embodiments of the invention disclose an array substrate and a method for manufacturing the same, and a display device. The method for manufacturing an array substrate comprising: forming a gate metal layer, wherein the gate metal layer comprises gate lines; film-forming an active layer and film-forming a signal line metal layer, wherein the signal line metal layer comprises data lines; and forming both a pattern of the active layer and a pattern of the signal line metal layer simultaneously using a half-tone mask process, wherein after film-forming the active layer and before film-forming the signal line metal layer, the method further comprising: hollowing out a first region of the active layer through a patterning process, wherein the first region is below the data lines in a display area, and the first region excludes portions of the active layer corresponding to overlapping regions of the data lines and the gate lines.

9 Claims, 6 Drawing Sheets

ARRAY SUBSTRATE AND METHOD FOR MANUFACTURING THE SAME, AND DISPLAY DEVICE

FIELD OF THE INVENTION

The invention relates to the field of display technology, in particular, to an array substrate and a method for manufacturing the same, and a display device.

BACKGROUND OF THE INVENTION

Liquid crystal displays have widely replaced the traditional CRT display devices because of its small volume, light weight, low power consumption, low voltage and no radiation and the like, and have been used in life and work.

A liquid crystal display is formed by aligning and assembling an array substrate and a color filter substrate, as shown in FIG. 1 and FIG. 2. FIG. 1 shows a plane structure of an array substrate in the prior art, and FIG. 2 is a cross-sectional diagram of the structure of the array substrate in FIG. 1 taken along line B-B'. As shown in FIG. 1 and FIG. 2, on a substrate 7, a gate metal layer (including a gate and gate line 8 in FIG. 1), a gate insulation layer 4, an active layer 5, a signal line metal layer, a pixel electrode layer, a passivation layer 2 and a common electrode layer are sequentially formed, wherein the signal line metal layer comprises a source and a drain of a thin film transistor, and data line 6 in the drawings, the pixel electrode layer comprises a pixel electrode 1 in FIG. 1, and the common electrode layer comprises a common electrode 3 in FIG. 2. Patterns of the active layer 5 and the signal line metal layer may be formed by using a half-tone mask process, as difference in difficulties in etching the active layer 5 and the signal line metal layer due to their difference in material, active tail phenomenon often occurs. For example, as shown in FIG. 2, active tail phenomenon occurs at edges of the active layer below the data line 6 in the display area (see the region A in FIG. 2). Usually, in order to avoid the occurrence of short circuit and signal interference, the pixel electrode 1 is required to be away from data line 6 as far as possible, however, as the existence of active tail (i.e., region A in FIG. 2), the existence of active tail must be taken into account during designing the distance between the pixel electrode 1 and the data line 6, which results in that the transmittance area of the pixel is decreased, and the aperture ratio is decreased.

SUMMARY OF THE INVENTION

Embodiments of the invention provide an array substrate and a method for manufacturing the same, and a display device, which can solve the problem that the aperture ratio is decreased due to the active tail.

In order to achieve the above object, embodiments of the invention adopt following solutions:

A method for manufacturing an array substrate comprises: a step of forming a gate metal layer, wherein the gate metal layer comprises gate lines; a step of film-forming an active layer and a step of film-forming a signal line metal layer, wherein the signal line metal layer comprises data lines; and a step of forming both a pattern of the active layer and a pattern of the signal line metal layer simultaneously using a half-tone mask process, wherein after the step of film-forming the active layer and before the step of film-forming the signal line metal layer, the method further comprises a step of:

hollowing out a first region of the active layer through a patterning process, wherein the first region is below the data lines in a display area, and the first region excludes portions of the active layer corresponding to overlapping regions of the data lines and the gate lines.

the method further comprises steps of:

forming a gate insulation layer above the gate metal layer and under the active layer; and hollowing out portions of the gate insulation layer corresponding to the first region through the patterning process.

Preferably, the method further comprises a step of:

forming a plurality of gate-insulation-layer through holes simultaneously by using the patterning process, wherein the gate-insulation-layer through holes are provided at edges of the array substrate and penetrate through the gate insulation layer and the active layer.

Embodiments of the invention provide an array substrate comprising thin film transistors, and data lines and gate lines provided crossly, a pattern of a layer where the data lines are located and a pattern of an active layer of the thin film transistors are formed simultaneously by using a half-tone mask process, wherein portions of the active layer provided below the data lines in a display area are hollowed out, except portions of the active layer corresponding to overlapping regions of the data lines and the gate lines.

Preferably, the thin film transistor further comprises: a gate insulation layer, which is provided below the active layer and above a layer where the gate lines are located, wherein portions of the gate insulation layer provided below the data lines in a display area are hollowed out, except portions of the gate insulation layer corresponding to overlapping regions of the data lines and the gate lines.

Furthermore, the array substrate is further provided with a plurality of gate-insulation-layer through holes penetrating through the gate insulation layer and the active layer at edges thereof.

Embodiments of the invention further provide a display device, which comprises any one of the above array substrates.

In the array substrate and the method for manufacturing the same, and the display device, before film-forming the signal line metal layer, corresponding portions of the active layer provided below the data lines in a display area are hollowed out (except portions of the active layer corresponding to overlapping regions of the data lines and the gate lines) by using the patterning process firstly, thus active tail below the data lines can be avoided when forming the pattern of the active layer and the pattern of the signal line metal layer simultaneously using a half-tone mask process, therefore, the distance between the pixel electrode and the data line may be further reduced, and hence the problem of decreased aperture ratio due to the active tail can be solved so as to obtain a high aperture ratio. Meanwhile, as the portions of the active layer below the data lines are hollowed out, the segment difference at the data lines can be reduced, thus the chance of Rubbing Mura (thin stripe-like defects formed on the panel due to the rubbing alignment process performed on an alignment film) is reduced, which can help to improve the yield and quality of image.

BRIEF DESCRIPTION OF THE DRAWINGS

To clearly describe embodiments of the invention, hereinafter, drawings used for describing the embodiments will be briefly introduced, apparently, the following drawings are just some embodiments of the invention, the persons skilled in the art can obtain other drawings from these drawings without creative efforts.

DETAILED DESCRIPTION OF THE EMBODIMENTS

Embodiments of the invention provide an array substrate and a method for manufacturing the same, and a display device, which can solve the problem of the decreased aperture ratio due to the active tail.

Solutions in the invention will be described thoroughly and completely below in conjunction with the drawings in the embodiments of the invention.

Embodiment 1

The embodiment provides a method for manufacturing an array substrate, which comprises: a step of forming a gate metal layer, wherein the gate metal layer comprises gate lines; a step of film-forming an active layer and a step of film-forming a signal line metal layer, wherein the signal line metal layer comprises data lines; and a step of forming both a pattern of the active layer and a pattern of the signal line metal layer simultaneously using a half-tone mask process, wherein after the step of film-forming the active layer and before the step of film-forming the signal line metal layer, the method further comprises a step of:

hollowing out a first region of the active layer through a patterning process, wherein the first region is below the data lines in a display area, and the first region excludes portions of the active layer corresponding to overlapping regions of the data lines and the gate lines.

In the method for manufacturing the array substrate, after film-forming the active layer and before film-forming the signal line metal layer, corresponding portions of the active layer provided below the data lines in a display area are hollowed out (except portions of the active layer corresponding to overlapping regions of the data lines and the gate lines) by using the patterning process firstly, thus active tail below the data lines can be avoided when forming the pattern of the active layer and the pattern of the signal line metal layer simultaneously using a half-tone mask process, therefore, the distance between the pixel electrode and the data line may be further reduced, and hence the problem of decreased aperture ratio due to the active tail can be solved so as to obtain a high aperture ratio. Meanwhile, as the portions of the active layer below the data lines are hollowed out, the segment difference at the data lines can be reduced, thus the chance of occurrence of Rubbing Mura is reduced, which can help to improve the yield and quality of image.

In the embodiment, the manner in which the first region of the active layer is hollowed out is not limited, and may be any manner well known to a person skilled in the art. To facilitate a person skilled in the art to understand, a method for manufacturing an array substrate in the embodiment will be described in detail below.

Figure 1:
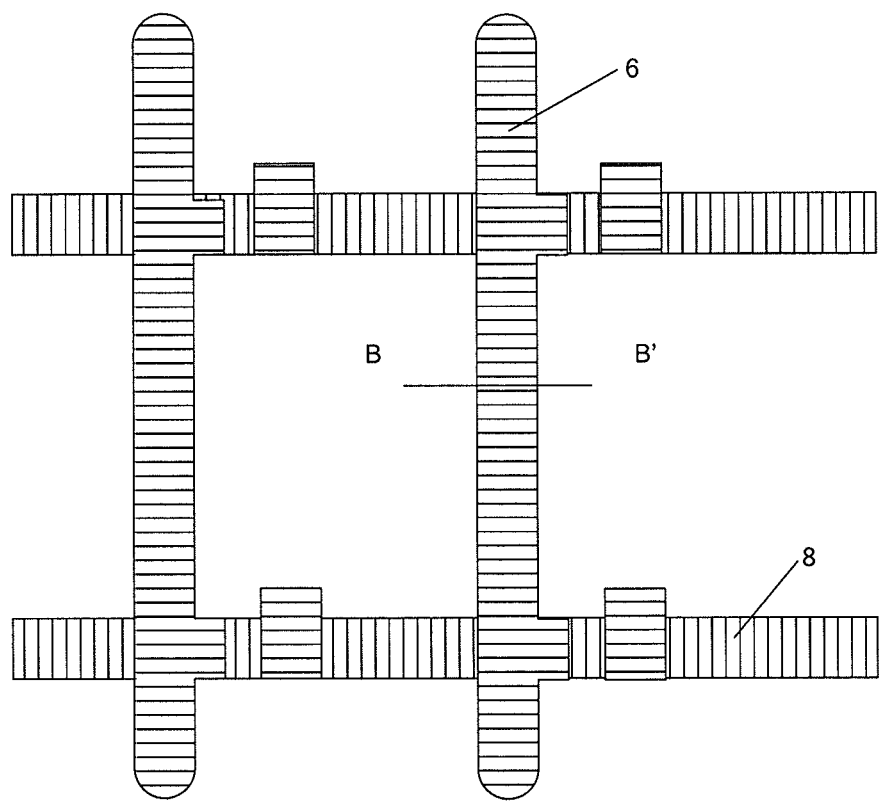
FIG. 1 is a plane structural diagram of an array substrate in the prior art.
Figure 2:
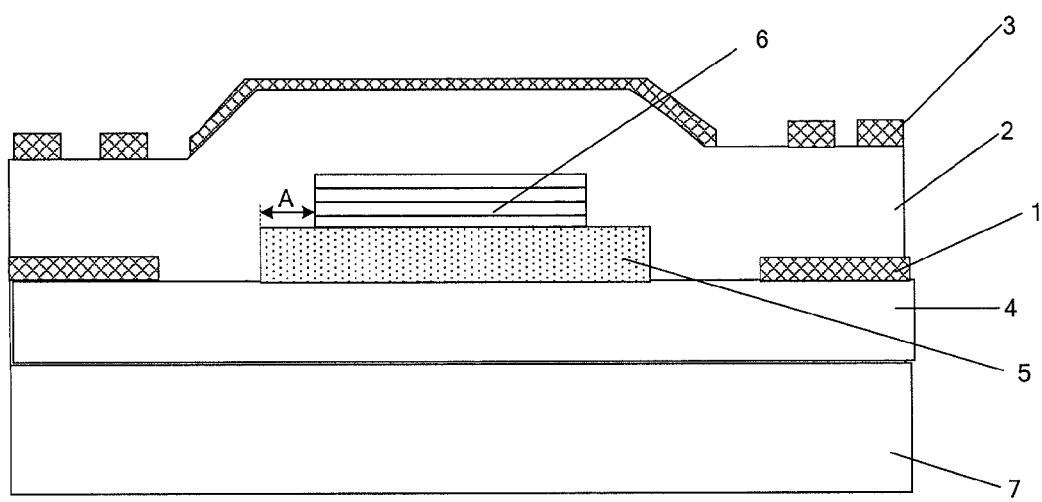
FIG. 2 is a cross-sectional diagram of the structure of the array substrate shown in FIG. 1 taken along line B-B'.
Figure 3:
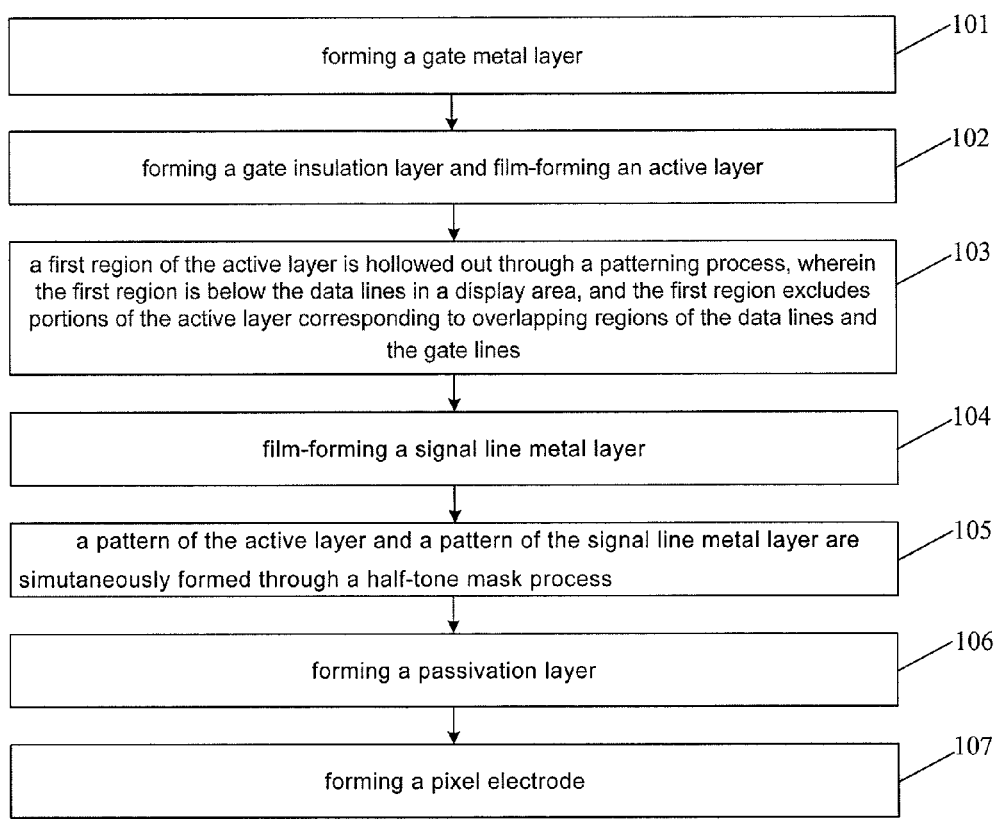
FIG. 3 is a flowchart of a method for manufacturing a TN-mode array substrate in embodiment 1 of the invention.

The method for manufacturing an array substrate in the embodiment will be described by taking a TN-mode array substrate as an example, as shown in FIG. 3, the method specifically comprises:

Step 101, forming a gate metal layer on a substrate, wherein the gate metal layer comprises gate lines.

In the step, the gate metal layer including gates, gate lines and other functional pattern is formed on the substrate through depositing, coating photoresist, exposure, development, etching, peeling off and the like (i.e., the first MASK).

Step 102, forming a gate insulation layer and film-forming an active layer.

In the step, the gate insulation layer and the active layer are sequentially deposited on the substrate.

step 103, a first region of the active layer is hollowed out through a patterning process, wherein the first region is below the data lines in a display area, and the first region excludes portions of the active layer corresponding to overlapping regions of the data lines and the gate lines.

Figure 5:
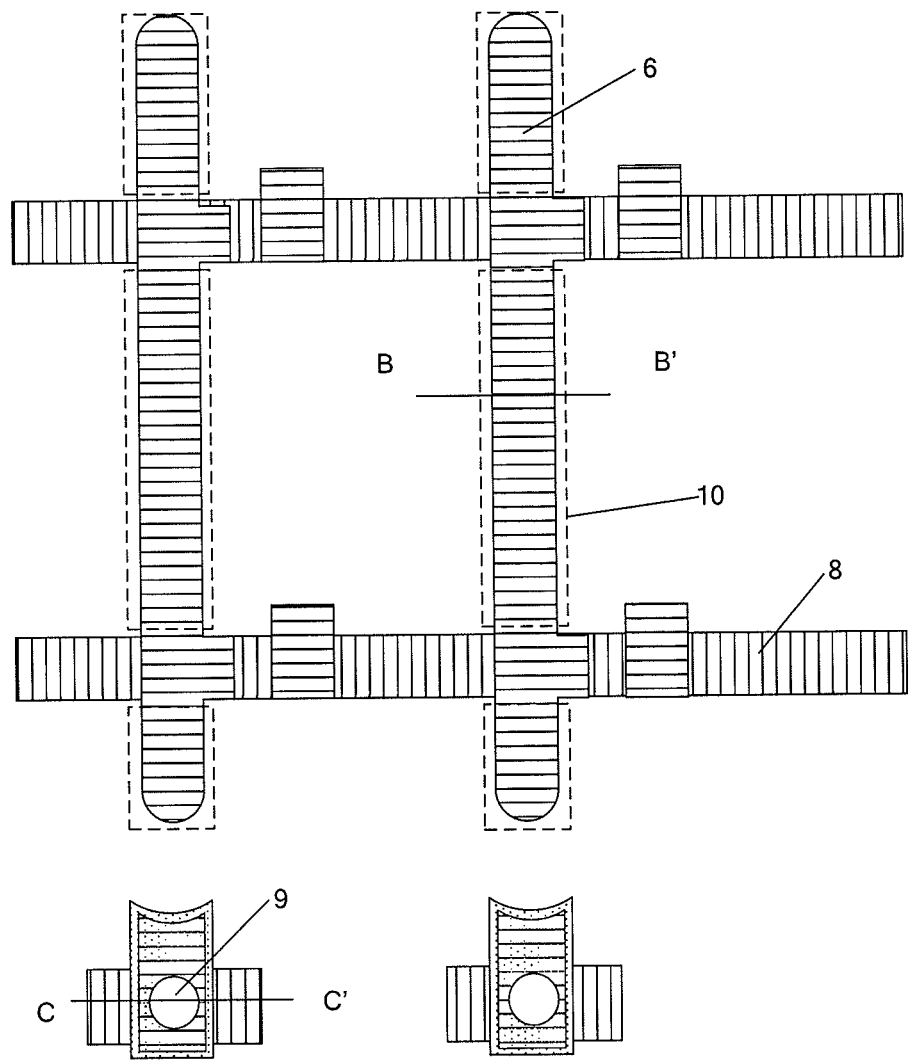
FIG. 5 is a plane structural diagram of an array substrate in embodiment 2 of the invention.

In the step, through depositing, coating photoresist, exposure, development, etching, peeling off and the like (i.e., the second MASK), an etching groove is formed at the first region, as shown in FIG. 5, the first region 10 is below the data lines 6 in the display area, and the first region 10 does not include portions of the active layer corresponding to overlapping regions of the data lines 6 and the gate lines 8. As shown in FIG. 5, the first region 10 is indicated by frames of dotted lines. Herein, the display area refers to the effective viewing portion of a display, and does not include the non-pixel regions at edges of the array substrate.

The method further comprises a step of forming a gate insulation layer above the gate metal layer and under the active layer, wherein portions of the gate insulation layer corresponding to the first region is hollowed out through the patterning process, in addition to hollowing out the first region of the active layer.

Specifically, the gate insulation layer is under the active layer, and in order to reduce the segment difference at the data lines, reduce the chance of occurrence of Rubbing Mura, and improve the yield and quality of image, preferably, in this step, in addition to hollowing out the first region of the active layer, portions of the gate insulation layer corresponding to the first region are also hollowed out; also, depending on actual requirements (mainly to reduce the segment difference), persons skilled in the art can determine portions of the gate insulation layer corresponding to the first region are removed completely or just thinned.

Step 104, film-forming a signal line metal layer, in the step, a metal film layer is first deposited so as to form the signal line metal layer.

Step 105, a pattern of the active layer and a pattern of the signal line metal layer are simultaneously formed through a half-tone mask process, and this step corresponds to a third MASK.

Figure 6:
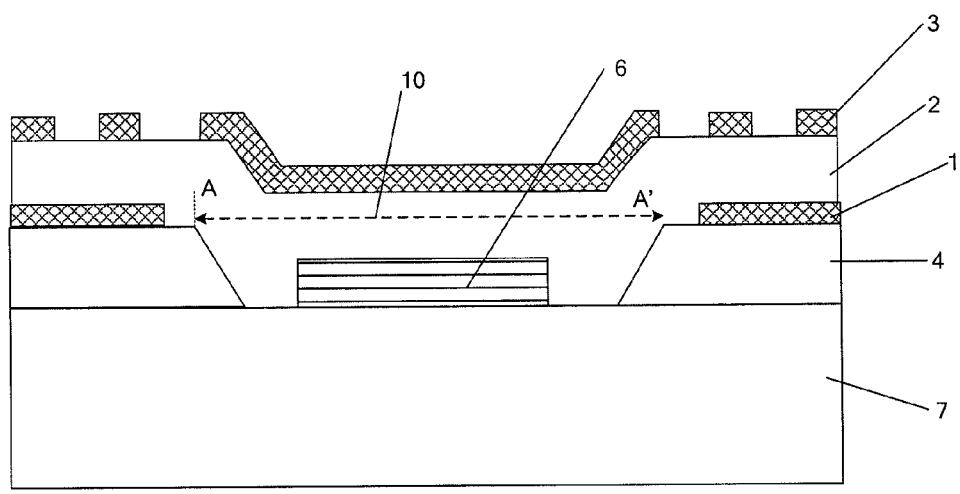
FIG. 6 is a cross-sectional diagram of the structure of the array substrate shown in FIG. 5 taken along line B-B'.

In the step, the pattern of the active layer and the pattern of the signal line metal layer are simultaneously formed through the half-tone mask process, that is, through a single exposure, the pattern of the active layer and the pattern of the signal line metal layer are formed by respective etching methods, and meanwhile, a channel of a thin film transistor (TFT) is formed. At this time, there is no active tail under the data line 6, as shown in FIG. 6. With reference to FIG. 6, region A-A' denotes the first region 10, as portions of the active layer and the gate insulation layer corresponding to the first region are hollowed out (the gate metal layer is also removed here), the data line 6 at the first region 10 is directly formed on the substrate 7.

The pattern of the signal line metal layer formed in the step comprises a source and a drain of the TFT, the data line and functional leads for function regions at edges of the array substrate (GOA unit), and the pattern of the active layer formed in this step mainly comprises the channel of the TFT.

Step 106, forming a passivation layer to cover above mentioned patterns, and forming a plurality of through holes by coating photoresist, exposure, etching and peeling off (the fourth MASK). The formed through holes penetrate through the passivation layer, and are arranged above the source of the TFT and in the bonding areas of the array substrate for various leads, and through these through holes the subsequently formed pixel electrode is connected to the source of the TFT and the various leads of the array substrate are connected to the bonding areas for connecting with the outside.

Step 107, forming a pixel electrode which is connected to the source of the TFT. In this step, the pixel electrode is formed through depositing, coating photoresist, exposure, etching and peeling off (the fifth MASK); and covering the through holes formed in the bonding areas of the array substrate in the step 106 to protect exposed wires below the through holes.

The above embodiment of the invention has been described by taking a TN-mode liquid crystal display panel as an example. There is also an ADS (Advanced-Super Dimensional Switching)-mode liquid crystal display panel, wherein a multi-dimensional electric field is formed by a parallel electric field generated at edges of slit electrodes (one of the pixel electrode and the common electrode is a slit electrode, and the other thereof is a plate-like electrode) which are in the same plane and a vertical electric field generated between a slit electrodes and a plate-like electrodes, so that liquid crystal molecules at all orientations which are located between the slit electrodes or directly above the electrodes in a liquid crystal cell can be rotated, thus the efficiency of the plane orientation system liquid crystal is improved and the transmittance is increased. ADS technology can improve the image quality of the TFT-LCD, and can bring out advantages of high transmittance, wide viewing angle, high aperture ratio, small chromatic aberration, high response speed, and free of push Mura and the like.

Figure 4:
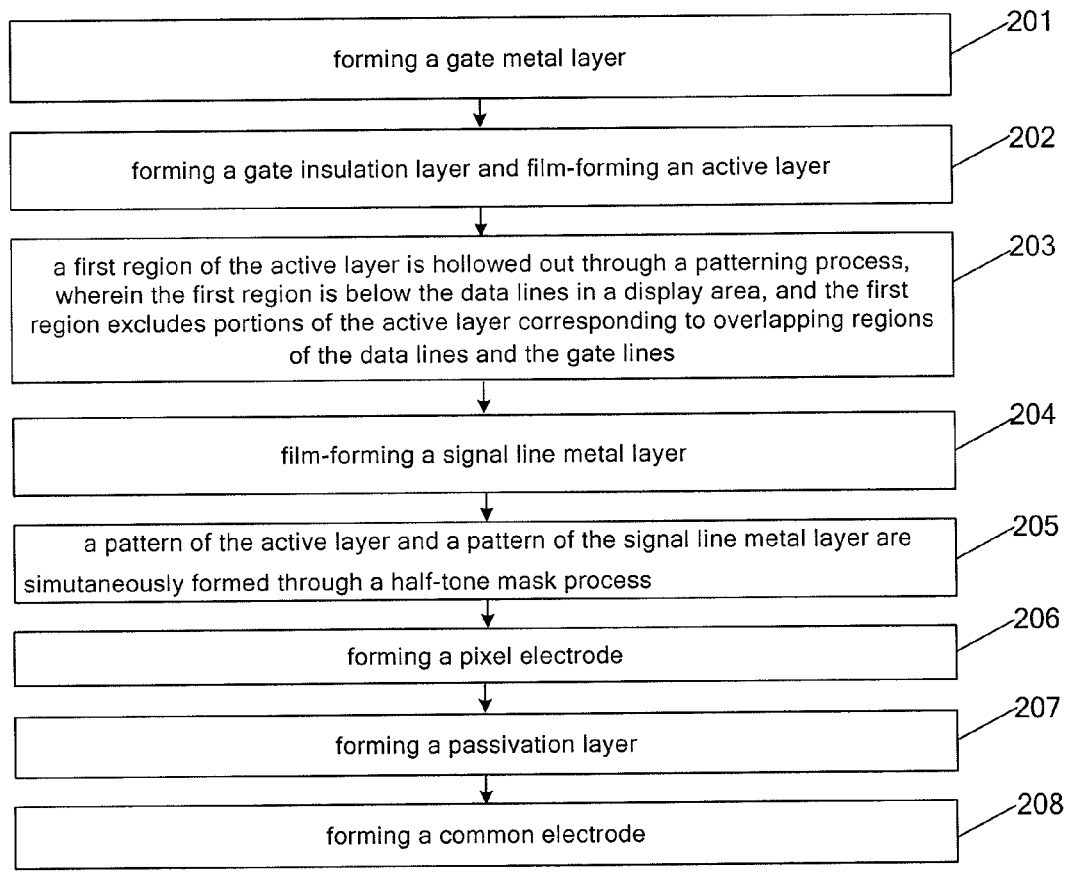
FIG. 4 is a flowchart of a method for manufacturing an ADS-mode array substrate in embodiment 1 of the invention.

As shown in FIG. 4, the embodiment also provides a method for manufacturing an ADS-mode array substrate, wherein the steps 201 to 205 are substantially the same as steps 101 to 105 in FIG. 3, and differences therebetween are in that, in the method for manufacturing an ADS-mode array substrate, a step 206 is performed firstly to form a pixel electrode, and then a step 207 is performed to form a passivation layer, and finally a common electrode is formed in a step 208. In the step 208, the common electrode is formed through depositing, coating photoresist, exposure, development, etching and peeling off (the sixth MASK).

Figure 7:
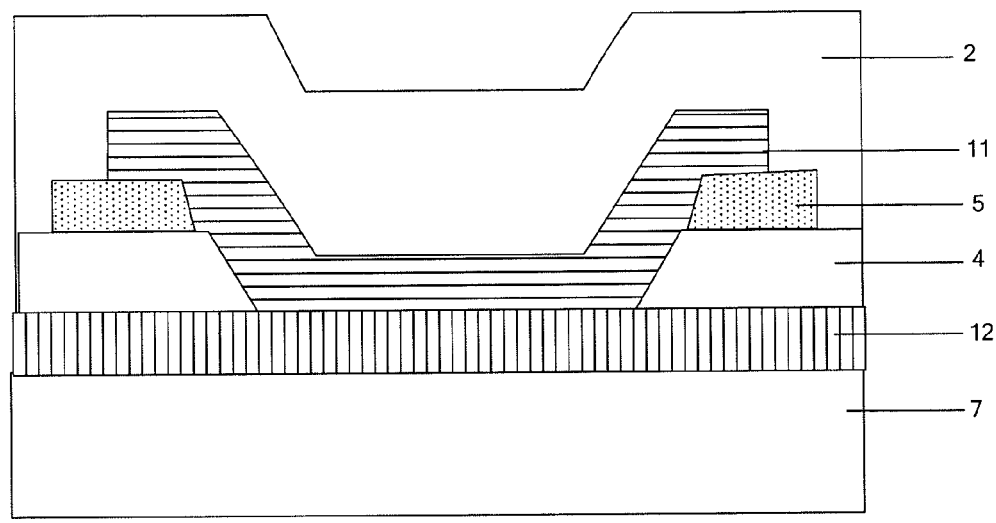
FIG. 7 is a cross-sectional diagram of the structure of the array substrate shown in FIG. 5 taken along line C-C'.

A specific structure of the ADS-mode array substrate is shown in FIGS. 5, 6 and 7. Furthermore, as the ADS-mode display panel and the TN-mode display panel are different in structure, the mask plate used in the steps 205, 206, 207 and 208 are different and thus the formed patterns are also different, and these differences do not directly relate to the invention, so the description thereof will be omitted.

It can seen from above, in the method for manufacturing the array substrate described in the embodiment, the TN-mode array substrate is manufactured through 5 MASKs, or the ADS-mode array substrate is manufactured through 6 MASKs, and there is no active tail below the data line 6 in the display area, therefore, the distance between the pixel electrode and the data line may be further reduced, and hence the problem of decreased aperture ration due to the active tail can be solved so as to obtain a high aperture ratio. Meanwhile, as portions of the active layer below the data lines are hollowed out, the segment difference at the data lines can be reduced, thus the chance of occurrence of Rubbing Mura is reduced, which can help to improve the yield and quality of image and reduce cost.

In addition, as to an array substrate provided with a GOA (Gate On Array, i.e. a gate driver integrated on the array substrate) unit at edges thereof, it is required to provide gate-insulation-layer through holes penetrating through the gate insulation layer and the active layer at bonding areas at edges so as to obtain conduction between the gate metal layer and the signal line metal layer for meeting special peripheral requirements (requirements for interior design of the GOA unit, which mainly refer to requirements for connecting with the gate lines), for example, connecting various leads in the gate metal layer with the gate lines, and connecting the GOA unit with the gate lines.

In the prior art, after the step of film-forming the active layer and before the step of film-forming the signal line metal layer, the gate-insulation-layer through holes are formed. Preferably, the step 103 (or the step 203) and the step of forming the gate-insulation-layer through holes may be performed simultaneously. Specifically, in the solution, as shown in FIGS. 5, 6 and 7, in the display area, portions of the active layer and the gate insulation layer corresponding to the first region 10 are hollowed out, while a plurality of gate-insulation-layer through holes 9 are formed at edges (non-display area) of the array substrate, in other words, through the above single patterning process, the gate-insulation-layer through holes 9 are formed at edges of the array substrate to penetrate through the gate insulation layer and the active layer. For example, FIG. 5 is a plane structure diagram of the array substrate, and FIG. 6 is a cross-sectional diagram of the structure of the array substrate in FIG. 5 taken along line B-B', to illustrate the structure of layers at the first region 10 below the data line 6. The portions of the active layer and the gate insulation layer 4 at the first region 10 are hollowed out (the portions of the gate metal layer here are also removed in the step 101 or step 201), so that the data line 6 at the first region 10 is directly provided on the substrate 7. FIG. 7 is a cross-sectional diagram of the structure of the array substrate in FIG. 5 taken along line C-C', to illustrate the structure of layers at the gate-insulation-layer through hole 9 provided at the edge of the array substrate, wherein the gate metal layer 12 is connected to the signal line metal layer 11, and the gate metal layer 12 and the signal line metal layer 11 at this position may function as a gate lead and a gate line respectively, and they are connected to each other through the gate-insulation-layer through hole 9.

In the above method for manufacturing an array substrate, the portions of the gate insulation layer and the active layer below the data line (at the first region) are removed while the gate-insulation-layer through holes are formed, without adding an extra process, and there is no active tail below the formed data line in the array substrate, therefore, the problem of decreased aperture ration due to the active tail can be solved so as to obtain a high aperture ratio. Meanwhile, the segment difference at the data lines can be reduced, thus the chance of occurrence of Rubbing Mura is reduced, which can help to improve the yield and quality of image and reduce cost.

Embodiment 2

The embodiment of the invention provides an array substrate, as shown in FIGS. 5, 6 and 7, which comprises thin film transistors, and data lines 6 and gate lines 8 provided crossly, a pattern of a layer where the data lines 6 are located and a pattern of an active layer 5 of the thin film transistors are formed simultaneously by using a half-tone mask process, wherein corresponding portions of the active layer 5 provided below the data lines 6 in a display area, except portions of the active layer 5 corresponding to overlapping regions of the data lines 6 and the gate lines 8, are hollowed out, that is, the portions of the active layer 5 at the first region 10 are removed.

In the array substrate in the embodiment, there is no active tail below the formed data line in the array substrate, therefore, the problem of decreased aperture ration due to the active tail can be solved so as to obtain a high aperture ratio. Meanwhile, the segment difference at the data lines can be decreased, thus the chance of occurrence of Rubbing Mura is reduced, which can help to improve the yield and quality of image and reduce cost.

The above thin film transistor further comprises: a gate insulation layer 4, which is provided below the active layer 5 and above a layer where the gate lines 8 are located (i.e., the gate metal layer 12), preferably, in the embodiment, corresponding portions of the gate insulation layer provided below the data lines 6 in a display area, except portions of the gate insulation layer corresponding to overlapping regions of the data lines and the gate lines, are also hollowed out, that is, the portions of the gate insulation layer 4 at the first region 10 are removed.

Thus, in manufacturing the above array substrate, the portions of the gate insulation layer and the active layer below the data lines (at the first region) are removed while the gate-insulation-layer through holes are formed, without adding an extra process, and there is no active tail below the formed data line in the array substrate, In the array substrate in the invention, corresponding portions of the active layer below the data lines in a display area (except portions of the active layer corresponding to overlapping regions of the data lines and the gate lines) are removed, thus there is no active tail below the data line, therefore, the distance between the pixel electrode and the data line may be further reduced, and hence the problem of decreased aperture ration due to the active tail can be solved so as to obtain a high aperture ratio. Meanwhile, as a portion of the active layer below the data line is hollowed out, the segment difference at the data line can be decreased, thus the chance of occurrence of Rubbing Mura is reduced, which can help to improve the yield and quality of image and reduce cost.

The embodiment further provides a display device, which comprises any one of above array substrates. With the display device, a higher aperture ratio can be obtained, and the yield and quality of image can be improved. The display device may be a liquid crystal panel, an electronic paper, an OLED panel, a mobile phone, a pad, a TV, a display, a notebook computer, a digital frame, a navigator and any product or part which is provided with display function.

The embodiments of the invention each is described in a progressive manner, like or similar parts between the embodiments may be referred to each other, and each embodiment mainly describes the difference from others. Especially, as to the device embodiment, as it is substantially similar to the method embodiment, thus it is described briefly, corresponding parts may referred to those of the method embodiment.

The above are only specific embodiments of the present invention, but the protection scope of the invention is not limited thereto, and persons skilled in the art will readily conceive various modifications or substitutes within the technical range disclosed in the invention, which should fall within the protection scope of the invention. Therefore, the protection scope of the invention should be defined by the claims.

The invention claimed is:

1. A method for manufacturing an array substrate comprising:
   a step of forming a gate metal layer, wherein the gate metal layer comprises gate lines;
   a step of film-forming an active layer and a step of film-forming a signal line metal layer, wherein the signal line metal layer comprises data lines; and
   a step of forming both a pattern of the active layer and a pattern of the signal line metal layer simultaneously using a half-tone mask process, wherein after the step of film-forming an active layer and before the step of film-forming a signal line metal layer,
   the method further comprises a step of:
   hollowing out a first region of the active layer through a patterning process,
   wherein the first region is below the data lines in a display area, and the first region excludes portions of the active layer corresponding to overlapping regions of the data lines and the gate lines.

2. The method of claim 1, wherein further comprising steps of:
   forming a gate insulation layer above the gate metal layer and under the active layer; and
   hollowing out portions of the gate insulation layer corresponding to the first region through the patterning process.

3. The method of claim 2, wherein further comprising a step of:
   forming a plurality of gate-insulation-layer through holes simultaneously by using the patterning process, wherein the gate-insulation-layer through holes are provided at edges of the array substrate and penetrate through the gate insulation layer and the active layer.

4. An array substrate comprising thin film transistors, and data lines and gate lines provided crossly, a pattern of a layer where the data lines are located and a pattern of an active layer of the thin film transistors are formed simultaneously by using a half-tone mask process, wherein
   portions of the active layer provided below the data lines in a display area are hollowed out, except portions of the active layer corresponding to overlapping regions of the data lines and the gate lines.

5. The array substrate of claim 4, wherein the thin film transistor further comprises: a gate insulation layer, which is provided below the active layer and above a layer where the gate lines are located, wherein
   portions of the gate insulation layer provided below the data lines in a display area are hollowed out, except portions of the gate insulation layer corresponding to overlapping regions of the data lines and the gate lines.

6. The array substrate of claim 5, wherein the array substrate is further provide with a plurality of gate-insulation-layer through holes penetrating through the gate insulation layer and the active layer at edges thereof.

7. A display device comprising the array substrate of claim 4.

8. A display device comprising the array substrate of claim 5.

9. A display device comprising the array substrate of claim 6.

* * * * *